(12) United States Patent
Block et al.

(10) Patent No.: US 6,365,478 B1
(45) Date of Patent: Apr. 2, 2002

(54) SOLID STATE ELECTRONIC DEVICE FABRICATION USING CRYSTALLINE DEFECT CONTROL

(75) Inventors: Thomas R. Block, Los Angeles; Michael Wojtowitz, Long Beach; Abdullah Cavus, Redondo Beach, all of CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/667,988

(22) Filed: Sep. 22, 2000

(51) Int. Cl.$^7$ .............................................. H01L 21/331
(52) U.S. Cl. ...................................................... 438/312
(58) Field of Search ................................ 438/312, 507, 438/508, 509

(56) References Cited

U.S. PATENT DOCUMENTS 4,119,994 A * 10/1978 Jain et al. .................... 257/198
6,143,631 A * 11/2000 Chapek ....................... 438/513
6,258,685 B1 * 7/2001 Fujita et al. ................. 438/312

OTHER PUBLICATIONS

"Nonlinear Feedback Control and Observer Design for the Modern Effusion Cell." Tucker, M.; and Meyer, D. Decision and Control, Proceedings of the 37th IEEE Conference. vol. 1, 1998, pp. 463–468.*

"Er–Doping Effects on Properties of Amorphous Silicon Films Prepared by Electron Beam Evaporations." Gan, R.; Wang, J. Thin Solid Films, vol. 293, 1997, pp. 63–66.*

Ben G. Streetman, "Solid State Electronic Devices", Prentice–Hall, 1990, 3rd Edition, pp. 19–24.

* cited by examiner

Primary Examiner—Vu A. Le
Assistant Examiner—Beth E. Owens
(74) Attorney, Agent, or Firm—McAndrews, Held & Malloy, Ltd.

(57) ABSTRACT

A solid state electronic device (40) comprising a substrate (30) and layers (32 and 34) is fabricated to control the formation of crystalline defects to control at least one characteristic of the device, such as current gain beta. The formation of crystalline defects preferably is controlled by controlling the temperature of the substrate, layers or both.

15 Claims, 2 Drawing Sheets

SOLID STATE ELECTRONIC DEVICE FABRICATION USING CRYSTALLINE DEFECT CONTROL

BACKGROUND OF THE INVENTION

The present invention relates generally to fabrication of solid state electronic devices, and more specifically to such fabrication which controls the formation of crystalline defects in such devices.

Experience has shown a need to control minority carrier lifetime in various solid state devices, including heterojunction bipolar transistors (HBTs). For example, it would be beneficial to produce HBT devices that have consistent current gain so that the circuit yield is high.

The prior art taught that the introduction of impurities, such as Au, into a high-speed diode can adjust the minority carrier lifetime. Prior HBTs use any of the following: graded, narrow, doped, or stepped base regions to adjust where the minority carriers will recombine. This invention addresses the problems presented by the foregoing prior art and provides a solution.

BRIEF SUMMARY OF THE INVENTION

Applicant has discovered a method of fabricating a solid state electronic device which is believed capable of controlling minority carrier lifetime. According to one embodiment, the device comprises a substrate and layers. The one embodiment introduces introduces crystalline defects in at least one of the layers and controls the densities in at least the one layer, whereby at least one characteristic of the device is controlled. For example, the current gain beta of the device can be controlled. The crystalline defect densities may be controlled by controlling the temperature of the substrate.

By using the method, the characteristics of a solid state electronic device can be controlled with a degree of ease and accuracy previously unattainable. For example, the one embodiment allows an engineer an additional in-process method to control where the minority carriers will recombine to achieve the desired current gain beta.

DETAILED DESCRIPTION OF THE PREFERRED EMBODIMENTS

Figure 1:
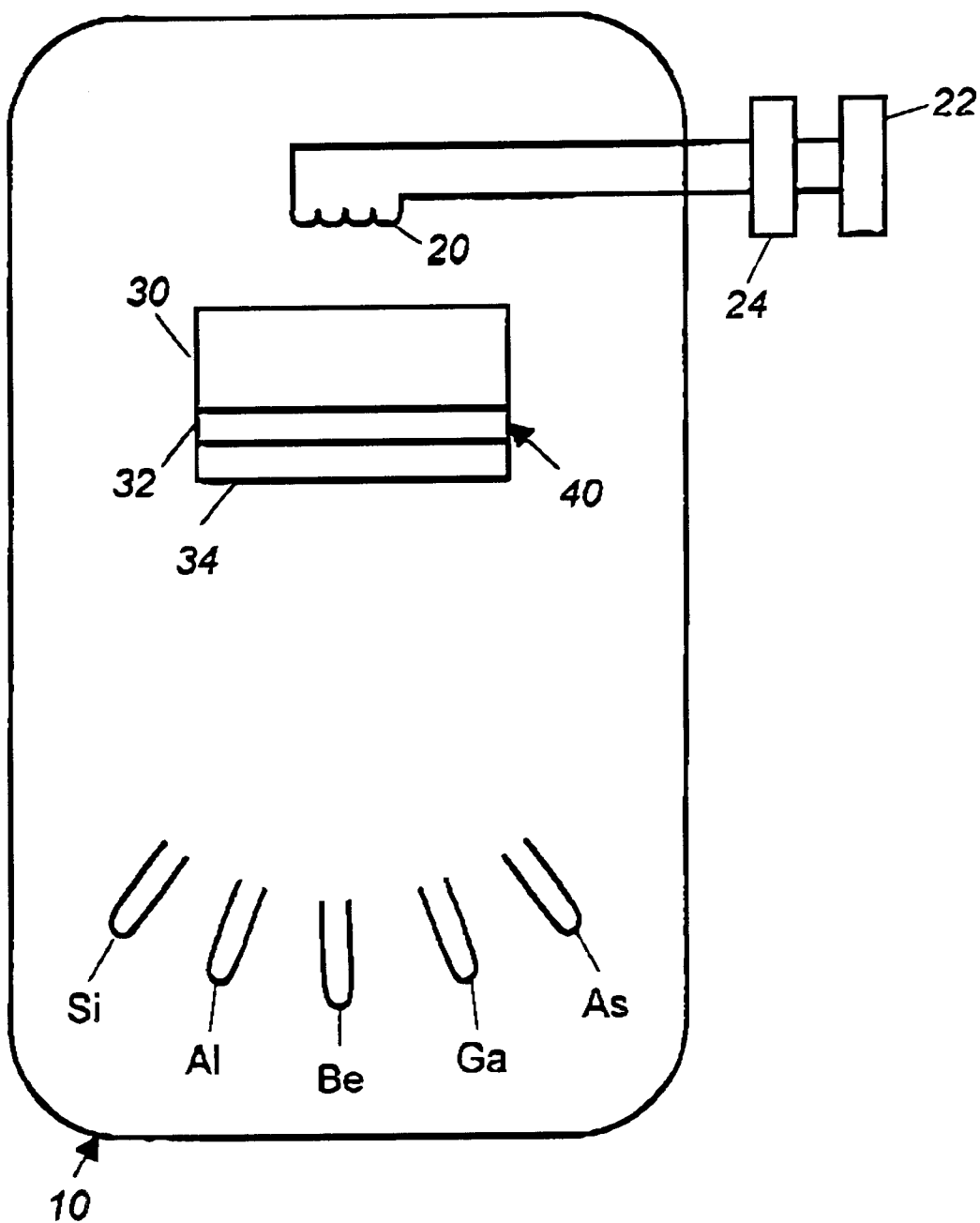
FIG. 1 is a schematic diagram of a preferred form of molecular beam epitaxy chamber useful for the preferred embodiment of the invention.

Referring to FIG. 1, the preferred embodiment preferably is carried out using a conventional molecular beam epitaxy process within a vacuum chamber 10. The chamber includes a conventional electrical coil heater 20 which is connected to a suitable electrical source 22 through a control device 24. By using heater 20 in a well known manner, the temperature of a substrate 30 can be controlled. In the preferred embodiment, the substrate comprises GaAs.

In a well known manner, layers, such as 32 and 34, are formed on substrate 30. The thickness of the layers is exaggerated in FIG. 1 so that the layers can be readily seen. As shown in FIG. 1, the layers may be formed of various substances or combinations of substances, such as Be, As, Ga, Al and Si. A vacuum chamber of the type shown in FIG. 1 is described in more detail in Solid State Electronic Devices, by Ben G. Streetman, (Prentice Hall, 3d Ed. 1990), pp., 19–24, which are incorporated by reference in their entirety into this application.

By using apparatus of the type shown in FIG. 1, defects or impurities are introduced into a compound semiconductor heterojunction bipolar transistor (HBT) wafer comprising substrate 30. The defects or impurities are introduced in appropriate densities in, for example, layers 32 and 34, to change the minority carrier lifetime (and related performance characteristics such as device current gain), but not cause other undesirable crystal damage. This process represents a controllable, in-process adjustment method that can be electrically monitored and tested on a semiconductor wafer on a lot-by-lot basis.

In order to achieve the foregoing result, a molecular beam epitaxy (MBE) process is carried out by means of the apparatus shown in FIG. 1 to produce a solid state electronic device, such as a semiconductor heterojunction bipolar transistor (HBT) 40. The growth temperature of the layers is adjusted according to the graph shown in FIG. 2 to cause the formation of crystalline defects. The concentration of these defects can be reproducibly controlled by adjusting the substrate temperature for each layer by means of heater 20.

Similarly, other methods can be used to introduce controlling defects such as impurities. These include ion gauge filaments, effusion cells, and electron beam evaporation. It is believed that this introduction of defects will change the minority carrier lifetime in the device in a controlled fashion.

Figure 2:
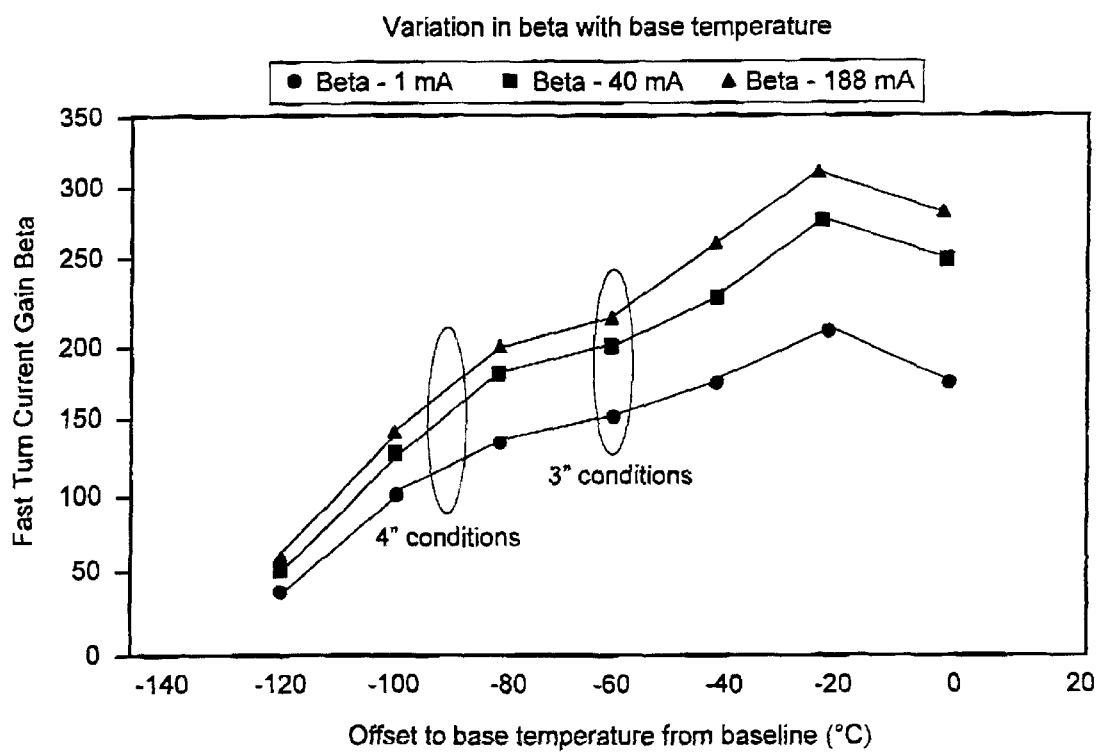
FIG. 2 is a graph illustrating the current gain at various device currents resulting from the use of various substrate temperatures during growth of the layers of the type shown in FIG. 1.

The effect of adjusting the substrate temperature to control current gain beta of the resulting electronic device is shown in FIG. 2. The horizontal axis of FIG. 2 shows a baseline temperature of 0 which corresponds to a range of 520–550 degrees Centigrade (C.) and a preferred value of 530 degrees C. Thus, the total range of temperatures represented by the numbers –120 to 0 shown in FIG. 2 corresponds to a range of 400–550 degrees C. As shown in the scale at the top of FIG. 2, the three lines corresponding to temperatures of the substrate illustrate the current gain beta of a resulting HBT solid state device at a particular device current. The lines tend to converge at the –120 mark on the horizontal axis, thereby indicating that the current gain beta of the resulting device is substantially independent of the current draw of the device.

While particular elements, embodiments and applications of the present invention have been shown and described, it will be understood that the invention is not limited thereto since modifications may be made by those skilled in the art, particularly in light of the foregoing teachings. It is therefore contemplated by the appended claims to cover such modifications as incorporate those features which come within the spirit and scope of the invention.

What is claimed is:

1. A method of fabricating a solid state electronic device comprising a substrate and layers, said method comprising introducing crystalline defects in at least one of the layers and controlling the densities of the defects in at least the one layer, whereby at least one characteristic of the device is controlled.

2. A method of fabricating a solid state electronic device comprising a substrate and layers, said method comprising introducing crystalline defects in at least one of the layers and controlling the densities of the defects in at least the one layer by controlling a temperature of at least one member of a group consisting of the substrate and at least the one layer whereby at least one characteristic of the device is controlled.

3. A method, as claimed in claim 2, wherein the method is carried out in a vacuum chamber comprising a heater and wherein controlling the temperature comprises controlling the heater.

4. A method, as claimed in claim 2, wherein controlling the temperature comprises controlling the temperature in a range from 400 degrees C. to 550 degrees C.

5. A method of fabricating a solid state electronic device comprising a substrate and layers, said method comprising controlling formation of crystalline defects in at least one of the layers by controlling a temperature of at least one member of a group consisting of the substrate and at least one of the layers by selecting a temperature at which beta of the device becomes substantially independent of a current draw of the device.

6. A method, as claimed in claim 2, wherein controlling the temperature comprises controlling the temperature for each of the layers.

7. A method of fabricating a heterojunction bipolar transistor comprising a substrate and layers, said method comprising introducing crystalline defects in at least one of the layers and controlling the densities of the defects in at least the one layer, whereby at least one characteristic of the heterojunction bipolar transistor is controlled.

8. A method, as claimed in claim 7, wherein the characteristic comprises current gain beta.

9. A method, as claimed in claim 1, wherein the characteristic comprises current gain beta at a predetermined device current.

10. A method of fabricating a heterojunction bipolar transistor comprising a GaAs substrate and layers, said method comprising introducing crystalline defects in at least one of the layers and controlling the densities of the defects in at least the one layer, by controlling impurities in at least the one layer, whereby at least one characteristic of the device is controlled.

11. A method of fabricating a solid state electronic device comprising a substrate and layers, said method comprising introducing crystalline defects in at least one of the layers and controlling the densities of the defects in at least the one layer by controlling impurities in at least the one layer, whereby at least one characteristic of the device is controlled.

12. A method, as claimed in claim 11, wherein controlling the impurities comprises using ion guage filaments.

13. A method, as claimed in claim 11, wherein controlling the impurities comprises using effusion cells.

14. A method, as claimed in claim 11, wherein controlling the densities comprises using electron beam evaporation.

15. A method, as claimed in claim 1, wherein said characteristic comprises minority carrier lifetime.

* * * * *